United States Patent
Chuang et al.

(10) Patent No.: US 9,431,413 B2
(45) Date of Patent: Aug. 30, 2016

(54) STI RECESS METHOD TO EMBED NVM MEMORY IN HKMG REPLACEMENT GATE TECHNOLOGY

(71) Applicant: Taiwan Semiconductor Manufacturing Co., Ltd., Hsin-Chu (TW)

(72) Inventors: Harry-Hak-Lay Chuang, Zhubei (TW); Wei Cheng Wu, Zhubei (TW); Ya-Chen Kao, Fuxing Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/547,251

(22) Filed: Nov. 19, 2014

(65) Prior Publication Data
US 2016/0141298 A1    May 19, 2016

(51) Int. Cl.
| | |
|---|---|
| *H01L 27/01* | (2006.01) |
| *H01L 27/12* | (2006.01) |
| *H01L 31/0392* | (2006.01) |
| *H01L 27/115* | (2006.01) |
| *H01L 29/06* | (2006.01) |
| *H01L 21/28* | (2006.01) |

(52) U.S. Cl.
CPC ... *H01L 27/11563* (2013.01); *H01L 21/28008* (2013.01); *H01L 29/0653* (2013.01)

(58) Field of Classification Search
CPC ............. H01L 21/762; H01L 21/3105; H01L 21/28556; H01L 21/02642; H01L 21/28079; H01L 21/28158; H01L 21/3141; H01L 21/8238; H01L 21/467; H01L 21/475; H01L 21/02126; H01L 21/8229; H01L 21/0228; H01L 21/67069; H01L 21/67075; H01L 23/53271; H01L 27/11514; H01L 27/0922; H01L 27/1104; H01L 29/435; H01L 29/66833

USPC ....... 257/288, 396, 347, 499, 506, 401, 652, 257/701, 760, E21.006, E21.009, E21.023, 257/E21.126, E21.127, E21.164, E21.17, 257/E21.21, E21.218, E21.229, E21.243, 257/E21.256, E21.257, E21.267, E21.278, 257/E21.293, E21.304, E21.314, E21.32, 257/E21.319, E21.416, E21.421, E21.423, 257/E21.435, E21.545, E21.547, E21.564, 257/E21.632, E21.645
See application file for complete search history.

(56) References Cited

U.S. PATENT DOCUMENTS 5,741,738 A * 4/1998 Mandelman ...... H01L 21/76224
                                                          438/296
5,753,561 A * 5/1998 Lee .................. H01L 21/76232
                                                          438/424

(Continued)

OTHER PUBLICATIONS

U.S. Appl. No. 14/481,987, filed Sep. 10, 2014.

*Primary Examiner* — David Nhu
(74) *Attorney, Agent, or Firm* — Eschweiler & Associates, LLC

(57) ABSTRACT

The present disclosure relates to a structure and method for reducing contact over-etching and high contact resistance (Rc) on an embedded flash memory HKMG integrated circuit. In one embodiment, an STI region underlying a memory contact pad region is recessed to make the STI surface substantially co-planar with the rest of the semiconductor substrate. The recess allows formation of thicker memory contact pad structures. The thicker polysilicon on these contact pad structures prevents contact over-etching and thus reduces the Rc of contacts formed thereon.

18 Claims, 13 Drawing Sheets

(56) References Cited

U.S. PATENT DOCUMENTS

| | | | | |
|---|---|---|---|---|
| 5,989,977 A * | 11/1999 | Wu | H01L 21/76224 | 438/431 |
| 6,165,906 A * | 12/2000 | Bandyo-padhyay | H01L 21/76235 | 438/700 |
| 6,171,180 B1 * | 1/2001 | Koutny, Jr. | H01L 21/31053 | 451/287 |
| 7,078,296 B2 * | 7/2006 | Chau | H01L 27/088 | 438/270 |
| 2011/0095348 A1 | 4/2011 | Chakihara et al. | | |
| 2014/0167141 A1 * | 6/2014 | Ramsbey | H01L 29/792 | 257/326 |

* cited by examiner

STI RECESS METHOD TO EMBED NVM MEMORY IN HKMG REPLACEMENT GATE TECHNOLOGY

BACKGROUND

The semiconductor manufacturing industry has experienced exponential growth over the last few decades. In the course of semiconductor evolution, the minimum feature sizes for semiconductor devices has decreased over time, thereby helping to increase the number of semiconductor devices per unit area on successive generations of integrated circuits (ICs). This device "shrinkage" allows engineers to pack more devices and more corresponding functionality onto newer generations of ICs, and is consequently one of the underlying drivers of the modern digital age. Another advancement that has helped improve the functionality of ICs has been to replace traditional polysilicon gates with metal gates, and to replace traditional silicon dioxide gate dielectrics with so called high-κ dielectrics. Whereas silicon dioxide has a dielectric constant of approximately 3.9, high-κ dielectrics have a dielectric constant of more than 3.9, which helps to reduce gate leakage and allows faster switching for transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
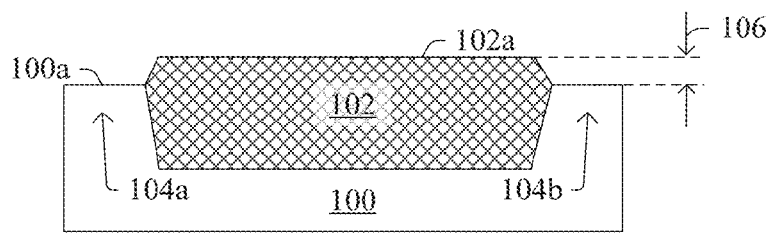
FIGS. 1-4 illustrate cross sectional images of a method of forming a contact over a contact pad region, according to some embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in the semiconductor manufacturing industry is to integrate different types of semiconductor devices onto a single integrated circuit (IC). Such integration can advantageously lower manufacturing costs, simplify manufacturing procedures, and increase performance of the final product. Embedded flash memory, which can integrate flash memory cells with other types of semiconductor devices, is one example of a technology where integration is advantageous. Traditional flash memory cells and corresponding logic devices are formed with polysilicon gates insulated by silicon dioxide. As semiconductor feature sizes get smaller, however, the logic devices of such embedded flash memory devices are reaching performance limits. Accordingly, high κ metal gate (HKMG) technology has become one of the front runners for the logic devices in the next generation of embedded flash memory devices. HKMG technology employs a metal gate separated from the underlying substrate by a material with a high dielectric constant κ (relative to silicon dioxide). The high κ dielectric reduces leakage current and increases the maximum drain current, and the metal gate mitigates the effects of Fermi-level pinning and allows the gate to be employed at lower threshold voltages. Further, the high κ dielectric and the metal gate collectively reduce power consumption. Thus, the aim for future generations of embedded flash memory is to integrate flash cells having polysilicon gates with HKMG logic devices.

Recent attempts to form such embedded flash memory devices have suffered from shortcomings. For example, one recent challenge arises from the fact that many embedded flash memory devices include a memory array region and a separate contact strapping region or memory contact pad region. Traditionally, the memory array region corresponds to an active area of bulk substrate where flash cells are arranged, and the memory contact pad region corresponds to a shallow trench isolation (STI) region. The STI region has an upper STI surface that is raised above an upper surface of the bulk substrate, such that there is a substrate height difference between memory array region and contact pad region. A wordline, memory gate, or other conductive body can be formed over the memory contact pad region, and contacts are formed over the memory contact pad region and ideally provide ohmic coupling to the wordline, memory gate, or other conductive body. Unfortunately, due to the height difference between the STI region and the bulk substrate; the wordline, memory gate, or other conductive body can have a diminished thickness in the memory contact pad region, which can lead to problems.

For example, in a traditional HKMG replacement gate process (RPG), a chemical mechanical polishing (CMP) operation usually planarizes all features to a height corresponding to an upper surface of a sacrificial polysilicon gate of the logic device. This CMP process will result in a memory gate over the memory contact pad region being thinner than the sacrificial polysilicon gate because of their difference in height above the semiconductor substrate. This means memory gate in the memory contact pad region will have thinner polysilicon after the CMP process. Thinner polysilicon memory gates will have higher sheet resistance (Rs), which can lead to contact over-etching (uncontrolled contact etching), and contact over-etching can result in a high contact resistance (Rc).

Accordingly, the present disclosure is directed to improved methods of semiconductor manufacturing that limit or prevent this undesired conductive body (e.g., memory gate) "thinning" over STI regions. FIGS. 1-4 illustrate cross sectional images of a method of forming a contact over an STI region, according to some aspects of the present disclosure. As will be appreciated in more detail below, this methodology recesses a portion of an STI region so that a subsequent CMP process retains a thicker conductive body over the STI region and thus provides lower sheet resistance and lower contact resistance to the conductive body.

FIG. 1 illustrates a cross sectional image of a semiconductor substrate 100 having an STI region 102 disposed therein. The STI region 102 is made of a dielectric material, such as silicon dioxide for example, and provides electrical isolation between neighboring active regions 104a, 104b, which are arranged on either side of the STI region 102. When initially formed, the STI region 102 has an upper STI surface 102a, which is disposed at a height 106 above an upper substrate surface 100a.

Figure 2:
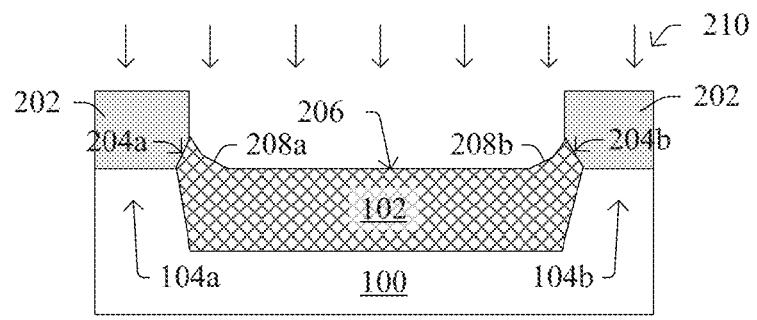

In FIG. 2, a mask 202 has been formed. This mask 202 covers peripheral STI regions 204a, 204b and leaves a central STI region 206 exposed. With this mask 202 in place, an etch process 210 is performed to recess the central STI region 206 relative to un-etched periphery STI regions 204a, 204b. Vertical, substantially vertical, or curved sidewalls 208a, 208b extend between the central STI region 206 and an uppermost portion of the peripheral STI regions 204a, 204b. This etch process 210 limits the height difference between a recessed STI surface 206 and the upper substrate surface 100a to limit challenges which were encountered in traditional approaches. The contours of the sidewalls 208a, 208b can take various forms depending on the etch conditions used, and although FIG. 2 shows an example where the upper surface of recessed STI region 206 is at least substantially aligned with the upper substrate surface 100a, in other examples the height of the recessed STI region 206 can remain slightly above that of the upper substrate surface 100a, or can be recessed below that of the upper substrate surface 100a.

Figure 3:
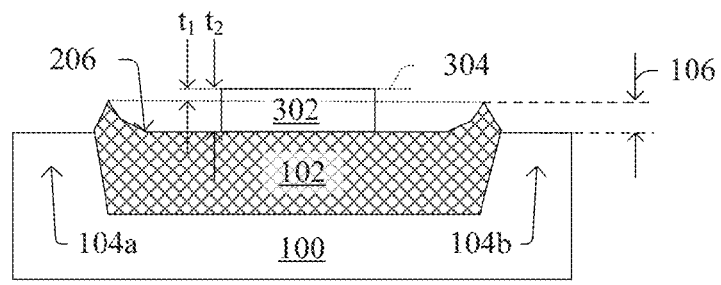

In FIG. 3, a conductive layer is formed and patterned to form a conductive contact pad 302, which is arranged over the recessed STI region 206. In some embodiments, conductive contact pad 302 comprises polysilicon. After patterning, the conductive contact pad 302 is CMPed down to a predetermined height 304. This predetermined height 304 can correspond to heights of other features on the substrate 100, for example gate heights of high-voltage and/or low-voltage devices or gate heights of flash memory cells. Compared to prior approaches where the STI region 102 remained un-recessed at height 106 and which had led to a very thin conductive contact pad having a thickness $t_1$, the present disclosure provides an increased thickness $t_2$ for the conductive contact pad 302. This increased thickness $t_2$ is due to recessed central STI region 206, which enables the contact pad 302 to have an additional thickness that is equal to the depth of the recess.

Figure 4:
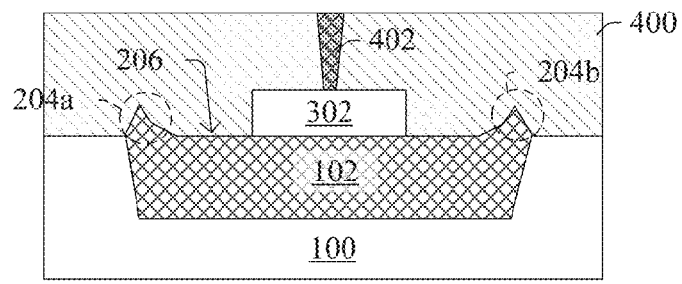

In FIG. 4, a dielectric 400 is formed, and contact openings are patterned in the dielectric 400 to expose an upper surface of the contact pad 302. A silicide is then formed over the exposed upper surface of the contact pad 302, and a metal contact 402 is formed to fill the remainder of the contact opening. Because contact pad 302 has an increased thickness compared to prior approaches due to the STI recess, the thicker contact pad 302 has a lower sheet resistance Rs. In particular, in prior approaches, the etch process for forming contact holes could extend too far into the relatively thin contact pad leading to a very high sheet resistance (Rs) and contact resistance (Rc) for the contact pad. The thicker contact pad 302 has a decreased sheet resistance Rs and decreased contact resistance Rc, which can improve device performance. In some embodiments, the STI region can be recessed by about 10-50 nm, and the sheet resistance of the conductive body can be 300-1000 ohm/square. Non-planar STI peripheral regions 204a, 204b, which can be an artefact in the final device, can evidence the use of such an STI recess process in some embodiments. Several examples of one context—namely, flash memory—where this approach is useful are described below. However, it will be appreciated that the approach contemplated by this disclosure is not limited to flash memory but is useful in a wide variety of semiconductor manufacturing technologies.

Figure 5:
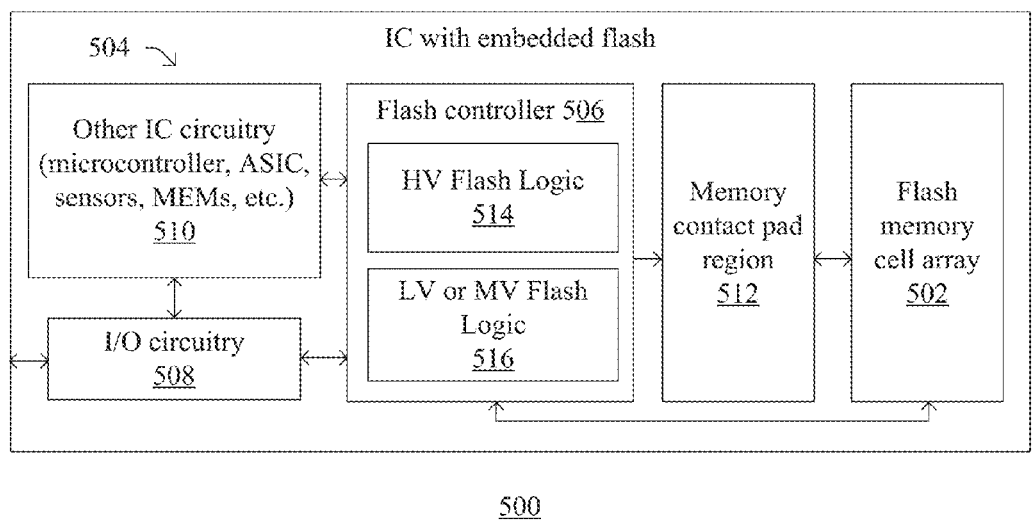
FIG. 5 illustrates a block diagram of some embodiments of an embedded flash memory device in accordance with some embodiments.

FIG. 5 illustrates an integrated circuit (IC) 500 which includes an array of flash memory cells 502, which store data, and periphery circuitry 504, which supports operation of the flash memory cells and/or provides other desired functionality. In FIG. 5's example, the periphery circuitry 504 includes a flash controller 506, input/output (I/O) circuitry 508, and other optional IC circuitry 510, such as microcontroller circuitry, application specific integrated circuit (ASIC) circuitry, sensors, and/or microelectromechanical systems (MEMS) for example. A memory contact pad region 512, which is distinct from cells of the memory array 502, can provide ohmic coupling between the flash memory array 502 and high voltage (HV) flash logic 514 and/or medium voltage (MV) or low-voltage (LV) flash logic 516 within flash controller 506. The memory cells of array 502 are localized to a memory region of the IC, and memory contact pad region 512 and logic devices of flash controller 506 are localized to a logic region of the IC, which is typically arranged around the periphery of the memory region.

Figure 6A:
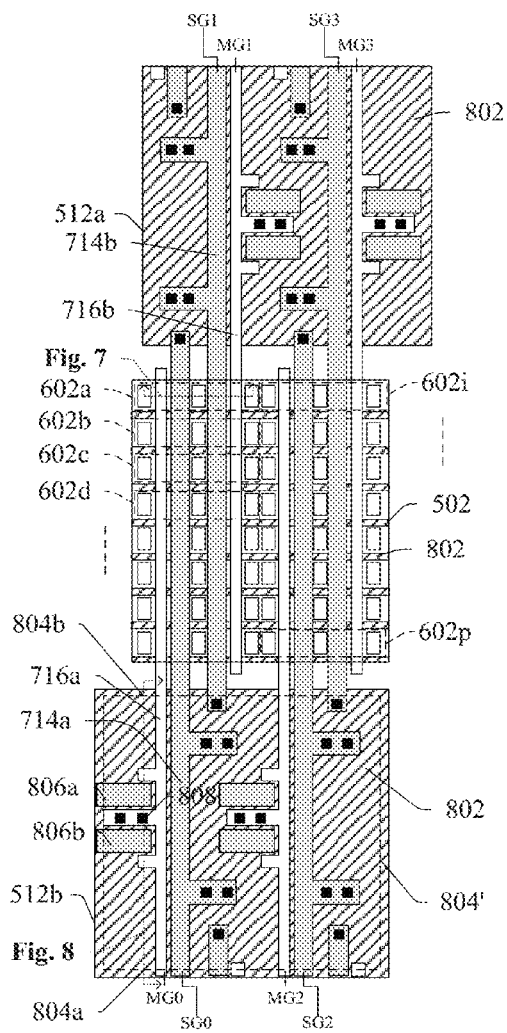
FIG. 6A illustrates a top view of some embodiments of an embedded flash memory device in accordance with some embodiments.
Figure 6B:
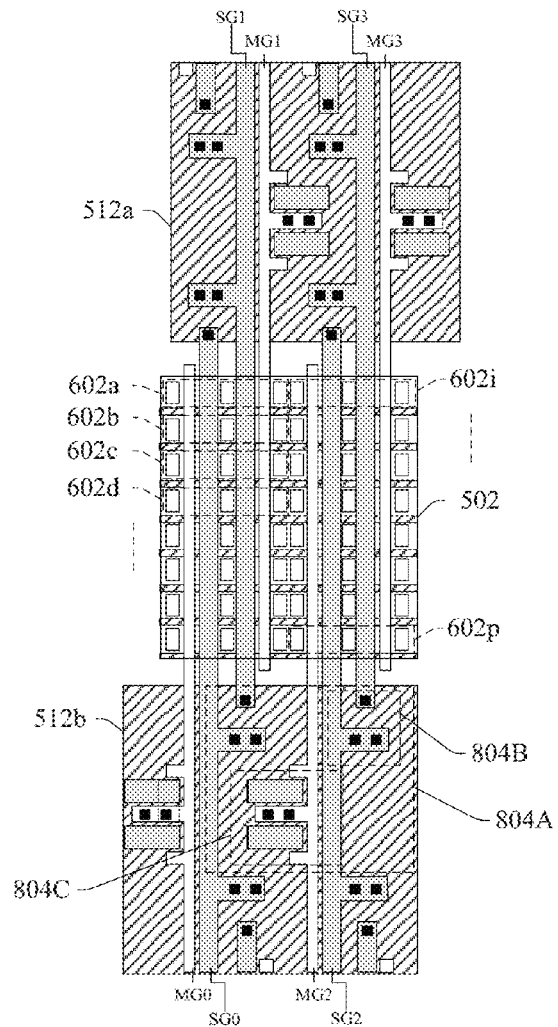
FIG. 6B illustrates a top view of some alternate embodiments of an embedded flash memory device in accordance with some embodiments.

With reference to FIG. 6A, a sample layout view of the memory contact pad region 512 and flash memory cell array 502 is provided. For purposes of simplicity, the illustrated array 502 is shown as being made up of sixteen pairs of split gate flash cells 602a-602p. It will be appreciated that although FIG. 6A shows sixteen pairs of flash memory cells, that other arrays can be made up of only a single flash memory cell or can include as many as a million memory cells, billion memory cells, etc. Further, although two distinct memory contact pad regions—namely upper and lower memory contact pad regions 512a, 512b—are shown, other devices can include only a single memory contact pad region or can include more than two memory contact pad regions. Thus, the illustrated layout is just an example, and is not to be limiting of the present concept. As will be appreciated in more detail below, in FIG. 6A STI region 802 has a non-planar periphery region along 804' that encompass a planar recessed surface within an area inside of 804', whereas FIG. 6B shows different examples of STI periphery regions. In FIG. 6B, 804A, 804B and 804C represent non-planar periphery regions that encompass planar inner surfaces. Even though FIG. 6B illustrates examples of regions 804A, 804B and 804C only, it will be appreciated that STI region 802 can have a recess along any shape or area, below any of the contact pads shown in the contact pad regions 512a and 512b.

Figures 7, 8:
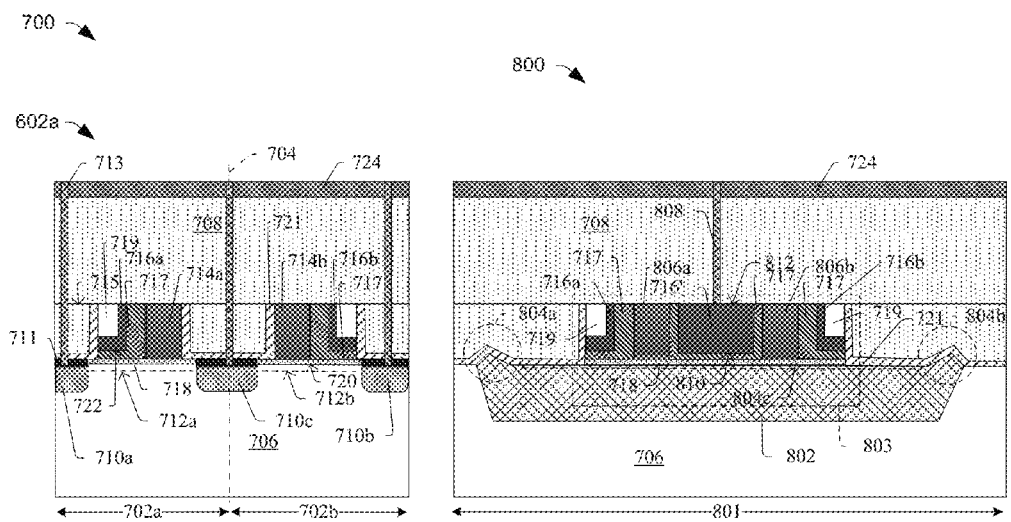
FIG. 7 illustrates a cross-sectional view of some embodiments of a pair of split gate flash memory cells as indicated in FIG. 6A.
FIG. 8 illustrates a cross-sectional view of some embodiments of a memory contact pad region disposed on a recessed STI (shallow trench isolation) surface as indicated in FIG. 6A.

FIG. 7 shows an embodiment of a semiconductor body 700, comprising a pair of split gate flash memory cells 602a. As shown in FIG. 7, within the array 502, each pair of split gate flash cells, e.g., pair 602a, is made up of a first memory cell 702a and a second memory cell 702b, which are mirror images of one another about an axis of symmetry 704 in some implementations. The first and second memory cells 702a, 702b (as well as the semiconductor devices of the peripheral circuitry 504 of FIG. 5) are formed over and/or within a semiconductor substrate 706, having an upper surface 720, and are covered by an interlayer dielectric 708. The pair of split gate flash cells 602a includes two individual source/drain regions 710a, 710b, and a common source/drain region 710c that is shared between the memory cells 702a, 702b. Silicide regions 711 are arranged on upper surface regions of the source/drain regions, and promote ohmic coupling of contacts 713 to the source/drain regions. Channel regions 712a, 712b separate the common source/drain region 710c from the individual source/drain regions 710a, 710b, respectively. The first and second memory cells include select gates 714a, 714b, respectively and memory gates 716a, 716b, respectively, over their channel regions 712a 712b, respectively. Each select gate and memory gate comprises a conductive material, such as a doped polysilicon layer. The select gates are disposed over a dielectric layer 718; and memory gates 716a and 716b are disposed over a charge trapping dielectric 717, having one or more dielectric layers. In one example, charge trapping dielectric 717 includes a charge trapping silicon nitride layer sandwiched between two silicon dioxide layers to create a three-layer stack collectively and commonly referred to as "ONO." Other charge trapping dielectrics may include a silicon-rich nitride film or a layer of silicon nanoparticle dots, or any film that includes, but is not limited to, silicon, oxygen, and nitrogen in various stoichiometries. The first and second memory cells further include sidewall spacers represented by reference numeral 719. A contact etch stop layer (CESL) 721 covers outer sidewalls of the flash memory cells and upper surface of the semiconductor substrate 706 and a dielectric protection layer 724 resides on upper of the interlayer dielectric 708. In this embodiment, reference numeral 715 represents horizontal plane along an upper surface of the memory gate 716a and 722 represents a horizontal plane along a bottom surface of the memory gate 716a.

Data is written to each memory cell, e.g., 702a, by changing the amount of charge trapped in the cell's charge trapping layer 717. The amount of trapped charge, which screens the electric field seen in the cell's channel region, e.g., 712a, thus controls the effective threshold voltage ($V_t$) of the memory cell and sets the data state stored in the cell. An example program, erase, and read operation will now be described as it relates to memory cell 702a. In order to "program" a high amount of charge to the cell, a positive voltage, on the order of 5 volts for example, is applied to individual source/drain region 710a while common source/drain region 710c and substrate 706 are grounded. A low positive voltage, on the order of 1.5 volts for example, is applied to select gate 714a while a higher positive voltage, on the order of 8 volts for example, is applied to memory gate 716a. As electrons are accelerated between the source and drain within channel region 712a, some of them will acquire sufficient energy to be injected upwards and get trapped inside charge trapping dielectric 717. This is known as hot electron injection. The trapped charge within charge trapping dielectric 717 stores the "high" bit within memory cell 702a, even after the various supply voltages are removed.

In order to "erase" the stored charge within memory cell 702a and return the state of memory cell 702a to a "low" bit, a positive voltage, on the order of 5 volts for example, is applied to common source/drain 710c while individual source/drain region 710a is floated or at a certain bias, and select gate 714a and substrate 706 are typically grounded. A high negative voltage, on the order of −8 volts for example, is applied to memory gate 716a. The bias conditions between memory gate 716a and common source/drain region 710c generate holes through band-to-band tunneling. The generated holes are sufficiently energized by the strong electric field under memory gate 716a and are injected upwards into charge trapping dielectric 717. The injected holes effectively erase the memory cell 702a to the "low" bit state.

In order to "read" the stored bit of memory cell 702a, a low voltage is applied to each of the select gate 714a, memory gate 716a, and individual source/drain region 710a in the range between zero and three volts, for example; while common source/drain region 710c and substrate 706 are typically grounded. In order to clearly distinguish between the two states, the low voltage applied to the memory gate 716a is chosen so that it lies substantially equidistant between the threshold voltage necessary to turn on the transistor when storing a "high" bit and the threshold voltage necessary to turn on the transistor when storing a "low" bit. For example, if the application of this equidistantly-arranged low voltage during the "read" operation caused substantial current to flow between regions 710a and 710c, then the memory cell is deemed to store a "low" bit. On the other hand, if the application of the equidistantly-arranged low voltage during the "read" operation does not cause substantial current to flow between regions 710a and 710c, then the memory cell is deemed to store a "high" bit.

During read and write operations, it is important to ensure that these bias voltages are ohmically provided to various regions of the memory cell. In particular, it is important to ensure that the bias voltages are ohmically provided to select gate 714a and memory gate 716a.

FIG. 8 shows a cross-sectional view of a semiconductor body 800 along a memory contact pad region 801 for the memory gate 716a, as indicated in FIG. 6A. This memory contact pad region 801 includes a memory gate contact structure 803 on an upper surface of a recessed region 804c of an STI region 802. The upper surface of the STI region 802 further comprises two non-planar periphery regions 804a and 804b that protrude above recessed surface 804c. Recessed surface 804 can be planar in some embodiments. The memory gate contact structure 803 includes a dummy select gate pair 806a and 806b, that are separated from memory gate extensions 716a residing on opposing sides of each dummy select gate, and from a memory gate contact pad 716' residing between adjacent sides of each dummy select gate by the charge trapping layer 717. The memory gate contact pad 716' is the region for forming ohmic contact and hence a vertical contact 808 abuts an upper surface 812 of the memory gate contact pad 716'. Memory gate 716a is a horizontal extension of the memory gate contact pad 716' from a location in the memory contact pad region to over the channel region 712a of the flash memory cell. The CESL 721 covers outer sidewalls of the memory gate contact structure 803 and upper surface of the semiconductor substrate 706, following a shape of the non-planar periphery regions 804a and 804b. As can be seen by comparing FIG. 7 and FIG. 8, the upper surface 812 of memory contact pad 716' is substantially co-planar with the upper surface 715 of the memory gate 716a and a bottom surface 810 of the contact pad 716' is substantially co-planar with the bottom surface 722 of the memory gate 716a.

As discussed above and as will be appreciated in greater detail below, by recessing a central portion of the STI region 802, the present disclosure mitigates the possibility of contact over-etching and provides the memory gate 716a and memory gate contact pad 716' with comparable thicknesses as other gates on the chip.

Figure 9:
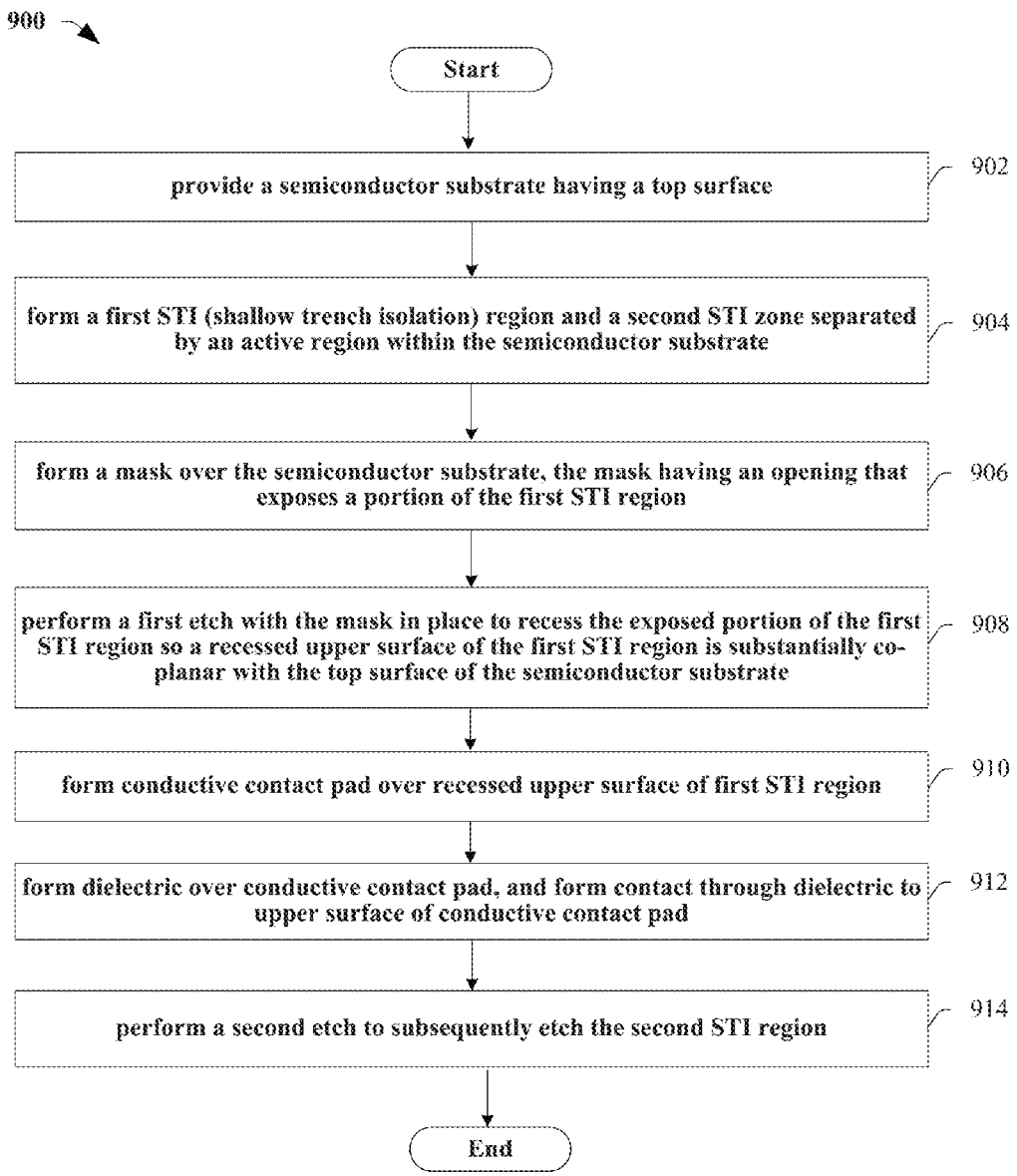
FIG. 9 illustrates a flow chart of some embodiments of a method of manufacturing a semiconductor structure according to the present disclosure.

FIG. 9 illustrates a method 900 of forming an embedded flash memory device in accordance with some embodiments. While the disclosed methods (e.g., the methods described by the flowchart 900 or 1000) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases According to the method 900, a semiconductor substrate having an upper surface is received at 902.

At 904, a first STI region and a second STI region, separated by an active region is formed within the semiconductor substrate. An STI region/region includes a shallow trench filled with a dielectric material to promote isolation between neighboring devices.

At 906, a mask is formed over the semiconductor substrate, the mask having an opening that exposes a portion of the first STI region.

At 908, a first etch is performed, with the mask in place, to recess the exposed portion of the first STI region, so that a recessed upper surface of the first STI region is substantially co-planar with the upper surface of the semiconductor substrate.

In 910, a conductive body, such as a memory gate, is formed on the recessed upper surface of the first STI region.

In 912, a dielectric is formed over the conductive body, and a contact is formed through the dielectric to ohmically couple to the conductive body.

At 914, a second etch is performed to etch the second STI region.

Figure 10:
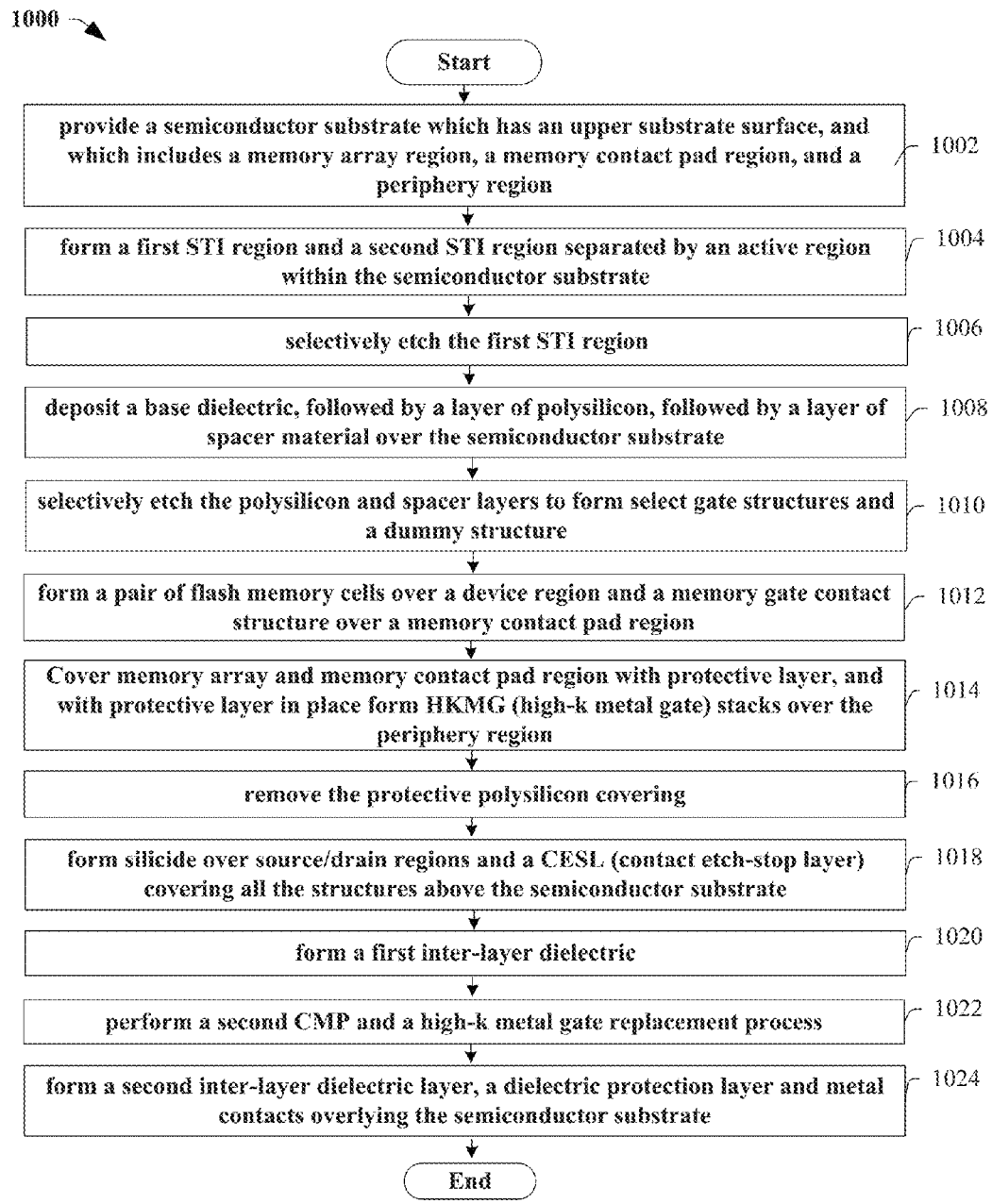
FIG. 10 illustrates a more detailed flow chart of some embodiments of a method of forming an integrated circuit according to the present disclosure.

FIG. 10 illustrates a more detailed flow diagram of a method 1000 of some embodiments for forming an integrated circuit according to the present disclosure.

At 1002, a semiconductor substrate having an upper surface is received. The semiconductor substrate includes a memory array region, a memory contact pad region, and a periphery region.

At 1004, a first STI region and a second STI region, separated by an active region is formed within the semiconductor substrate.

At 1006, the first STI region is etched with the help of a mask placed above the semiconductor substrate, such that the second STI region is protected during the etch.

At 1008, a base dielectric, followed by a layer of polysilicon, followed by a layer of spacer material is deposited over the semiconductor substrate.

At 1010, the polysilicon and spacer layers are selectively etched to form select gate structures in a device and a memory contact pad region, and a dummy structure in a logic/periphery region.

At 1012, more structures are formed to complete formation of a pair of flash memory cells in the memory array region and a memory gate contact structure in the memory contact pad region. At 1014, a protective polysilicon covering is formed over the memory array region and memory contact pad region, and HKMG stacks are formed in the periphery region. The HKMG stacks include a HV (high voltage) HKMG stack. During their formation, the device and memory contact pad regions are protected by the polysilicon covering.

At 1016, the protective polysilicon layer is completely removed from the device and memory contact pad regions.

At 1018, a silicide is formed over the source/drain regions and a contact etch-stop layer (CESL) is formed over the entire semiconductor substrate, covering the devices and structures.

At 1020, a first inter-layer dielectric is formed over the semiconductor substrate.

At 1022, a second CMP is performed until the upper surface of the sacrificial polysilicon layer is exposed. HKMG replacement gate process is then carried out.

At 1024, a second interlayer dielectric layer, a dielectric protection layer and metal contacts are formed.

FIGS. 11-23 depict a series of cross-sectional views that collectively depict a method of manufacturing a semiconductor structure at various stages of manufacture. For clarity, FIGS. 11-23 are described in relation to the method 1000, however, it will be appreciated that the method 1000 is not limited to the structures disclosed in FIGS. 11-23.

Figure 11:
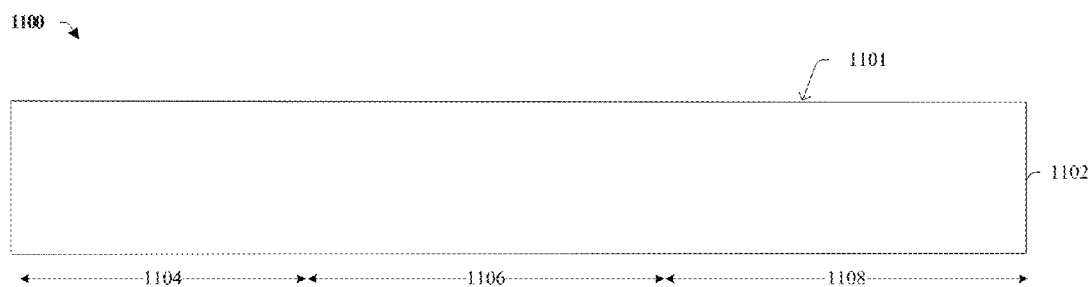
FIGS. 11-23 illustrate a series of cross-sectional views that collectively depict a method of forming an integrated circuit with embedded flash memory and a recessed STI surface for contact pad region in accordance with some embodiments.

FIG. 11 illustrates a cross-sectional view of a semiconductor body 1100, corresponding to act 1002 of method 1000. The semiconductor body 1100 includes a semiconductor substrate 1102 having an upper surface 1101, on which memory devices and peripheral devices (e.g., CMOS devices) are formed. In some embodiments, the semiconductor substrate 1102 can be a bulk silicon substrate, a silicon-on-insulator (SOI) substrate, a binary semiconductor substrate (e.g., GaAs), a tertiary semiconductor substrate (e.g., AlGaAs), or a higher order semiconductor substrate, for example. Any of these substrates can include doped regions formed in the substrate, one or more insulating layers formed in or on the substrate, and/or conducting layers formed in or on the substrate.

Figure 12:
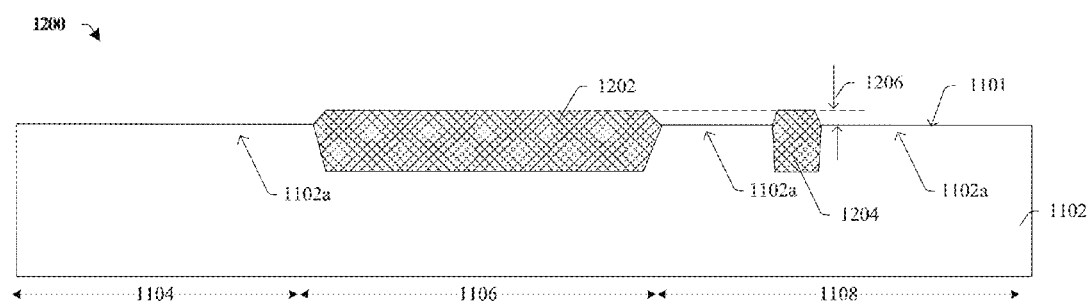

FIG. 12 illustrates a cross-sectional view of a semiconductor body 1200, corresponding to act 1004 of method 1000 in FIG. 10. Here a first STI region 1202 and a second STI region 1204 are formed within the substrate 1102. The first and second STI regions 1202 and 1204 are separated by an active region 1102a. Upper surfaces of the first STI region 1202 and the second STI region 1204 are placed at a height 1206 above the upper surface 1101. An STI region/region includes a shallow trench filled with a dielectric material or doped semiconductor material to promote isolation between neighboring devices.

Figure 13:
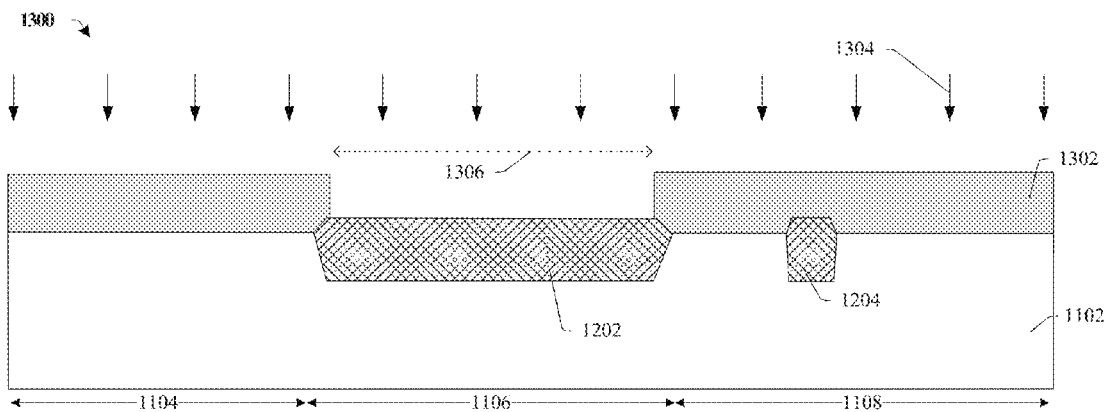

FIG. 13 illustrates a cross-sectional view of a semiconductor body 1300, corresponding to act 1006 of method 1000 in FIG. 10. A mask 1302 is placed above the substrate 1102 in such a way that a mask opening 1306 is aligned with a specific region of the first STI region 1202 and an etch 1304 is performed. In various embodiments, etch 1304 may be performed using a dry etchant (e.g., an RIE etch, a plasma etch, etc.) or a wet etchant (e.g., hydrofluoric acid). In some embodiments opening 1306 can be wider, such that edges of the opening 1306 align with outer edges of the first STI region 1202.

Figure 14:
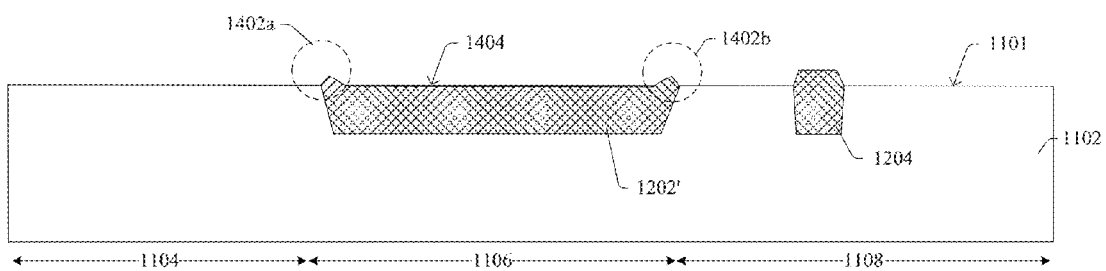

FIG. 14 illustrates a cross-sectional view of a semiconductor body 1400, corresponding to act 1006 of method 1000 in FIG. 10. After performing etch 1304 on the semiconductor substrate 1102, the first STI region 1202 is transformed to STI region 1202', which has a planar recessed upper surface 1404 and two non-planar periphery regions, 1402a and 1402b. Recessed surface 1404 is substantially co-planar with upper surface 1101 of the semiconductor substrate 1102. STI region 1204 is protected during the etch 1304.

Figure 15:
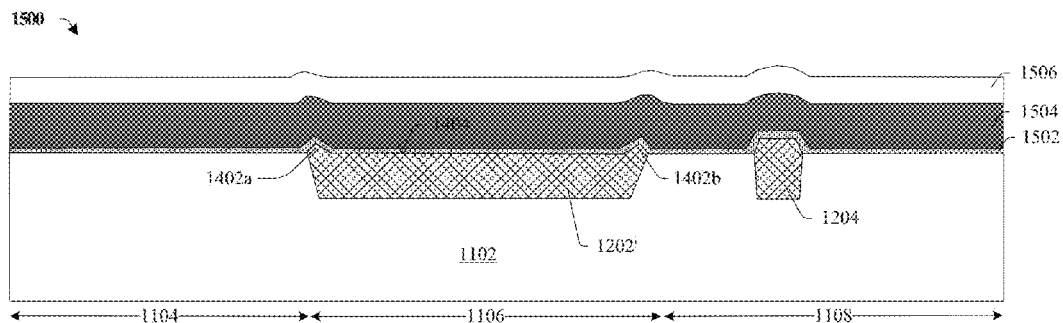

FIG. 15 illustrates a cross-sectional view of a semiconductor body 1500, corresponding to act 1008 of method 1000 in FIG. 10. Here, a base dielectric 1502 is deposited over the semiconductor substrate 1102, followed by deposition of a polysilicon layer 1504 and a spacer material layer 1506. In some embodiments, the base dielectric layer 1502 comprises an oxide layer, a nitride layer, silicon oxy-nitride (SiON) layer, or a high-k gate dielectric which resides on upper of the semiconductor substrate 1102 and helps protect the semiconductor substrate 1102 during future etching steps. In some embodiments, layers 1502, 1504 and 1506 may be formed using a vapor deposition technique (e.g., PVD, CVD, PE-CVD, etc.).

Figure 16:
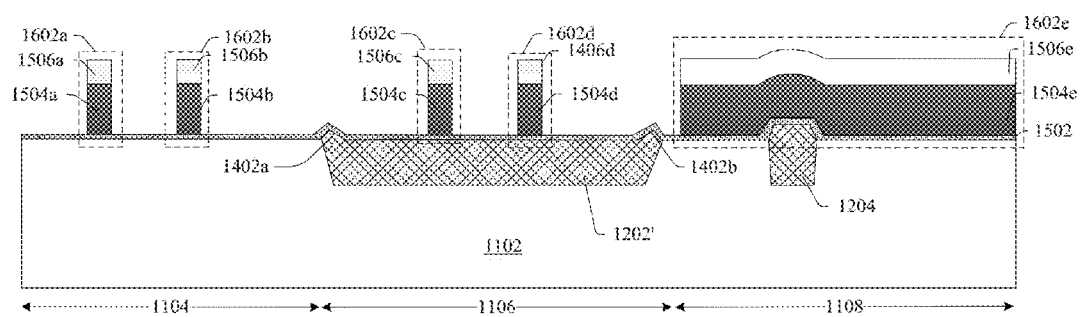

FIG. 16 illustrates a cross-sectional view of a semiconductor body 1600, corresponding to act 1010 of method 1000 in FIG. 10. Here, the polysilicon layer 1504 and the spacer material 1506 are selectively etched to form select gate stacks 1602a and 1602b over memory array region 1104, select gate stacks 1602c and 1602d over a memory contact pad region 1106 and a dummy structure 1602e over a periphery region 1108 respectively. Select gate stack 1602a is formed of select gate 1504a and spacer cap 1506a, 1602b made up of 1504b and 1506b, 1602c made up of 1504c and 1506c, 1602d made up of 1504d and 1506d and dummy structure 1602e made up of 1504e and 1506e. 1504a and 1504b later become select gates for memory cells formed over 1104 and 1504c and 1504d become dummy select gates for the memory gate contact structure formed over 1106. Polysilicon layer 1504 and spacer layer 1506 may be etched using a dry etchant (e.g., an RIE etch, a plasma etch, etc.) or a wet etchant (e.g., hydrofluoric acid).

Figure 17:
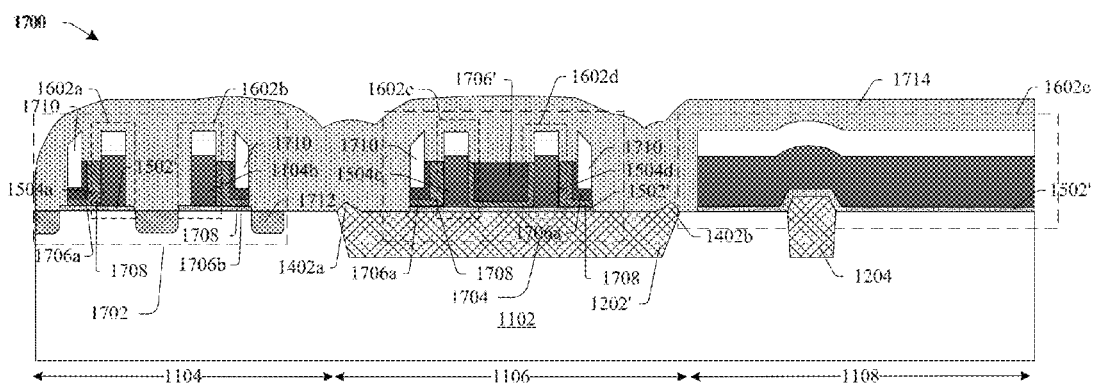

FIG. 17 illustrates a cross-sectional view of a semiconductor body 1700, corresponding to act 1012 of method 1000 in FIG. 10. A pair of flash memory cells 1702 is formed over the memory array region 1104 and a memory gate contact structure 1704 is formed over the memory contact pad region 1106. The pair of split gate flash of the memory cells comprises select gate stacks 1602a and 1602b, memory gates 1706a and 1706b residing adjacent to opposing sidewalls of 1602a and 1602b respectively, a charge-trapping dielectric 1708 which extends below each memory gate and a sidewall spacer 1710 which abuts an outer sidewall of each memory gates 1706a and 1706b. In some embodiments, the memory gates 1706a and 1706b can have a square or rectangle shape, rather than an 'L' shape, as illustrated in this embodiment. Source/drain regions 1712 are formed within the substrate 1102 in the memory array region. Also, the base dielectric layer 1502 has been selectively etched to become 1502' that resides in specific locations over the substrate 1102. In one example, charge trapping dielectric 1708 includes a charge trapping silicon nitride layer sandwiched between two silicon dioxide layers to create a three-layer stack collectively and commonly referred to as "ONO." Other charge trapping dielectrics may include a silicon-rich nitride film or a layer of silicon nanoparticle dots, or any film that includes, but is not limited to, silicon, oxygen, and nitrogen in various stoichiometries.

The memory gate contact structure 1704 for the memory gate 1706a comprises memory gate extensions 1706a that extend from the memory array region 1104 to the memory contact pad region 1106. The memory gate extension that resides between adjacent sidewalls of the dummy select gates 1504c and 1504d form the memory contact pad 1706', or a region where a metal contact is formed. In other words, dummy select gates 1504c and 1504d, which can be made of polysilicon, are disposed on outer sidewalls of the memory gate contact pad 1706' in the memory gate contact structure 1704. Sidewall spacers 1710 further abut outer sidewalls of memory gate extensions 1706a. Further, a protective polysilicon layer 1714 is disposed above the semiconductor substrate 1102, covering the flash memory cell pair 1702, memory gate contact structure 1704 and dummy structure 1602e.

Figure 18:
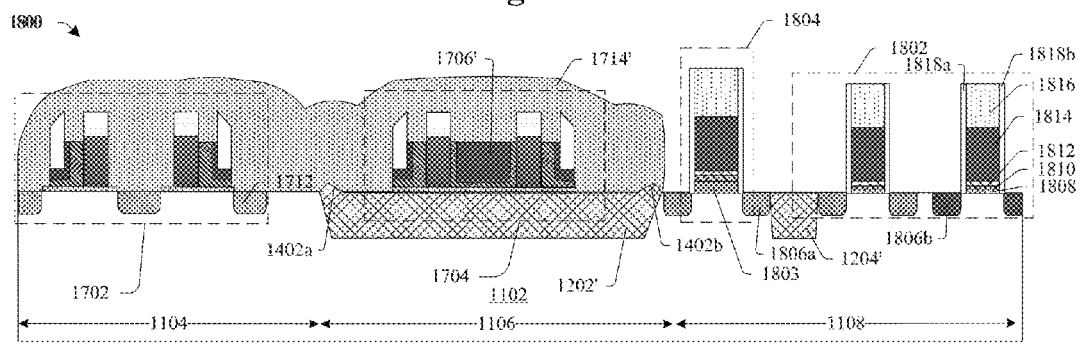

FIG. 18 illustrates a cross-sectional image of semiconductor body 1800, corresponding to act 1014. The protective polysilicon layer 1714 is etched to form 1714', and the dummy structure 1602e is removed from over the periphery region. As shown by semiconductor body 1800, with the protective polysilicon layer 1714' in place, low-voltage HKMG stacks 1802 are then formed over the periphery region 1108, and HV HKMG stack 1804 is formed over 1108, as now described. In some embodiments, a HV dielectric layer 1803 is formed by selectively patterning and etching a HTO (high temperature oxide) layer formed by exposing the substrate to an elevated temperature (e.g., approximately 1000° C.) during a furnace oxidation process. In some embodiments, a wet etching process is performed to define the locations of HV dielectric layer 1803, while in other embodiments a dry etching process may be used. The thickness of the HV dielectric layer 1803 is between approximately 80 angstroms and 200 angstroms, being approximately 180 Angstroms in some embodiments. After the HV dielectric 1803 is formed and patterned, a high k dielectric layer 1810, an etch-stop layer (ESL) 1812, a sacrificial polysilicon layer 1814, and a hard mask layer 1816 are formed. In some embodiments, the high k dielectric layer 1810 comprises HfO (hafnium oxide), HfSiO (hafnium silicon oxide), HfAlO (hafnium aluminum oxide), or HfTaO (hafnium tantalum oxide). A photoresist mask is then formed over the hardmask 1816, and an etch is carried out until the ESL 1812, which is usually a metal layer, is reached. Sidewall spacers 1818a, 1818b are then conformally formed on sidewalls of the gate stacks. Source/drain regions 1806a, and 1806b are formed, for example by self-aligned ion implantation within the substrate 1102. The second STI region 1204 can also be planarized using an etch process to form a planarized STI region 1204'. In various embodiments, the second STI region may be etched using a dry etchant (e.g., an RIE etch, a plasma etch, etc.) or a wet etchant (e.g., hydrofluoric acid).

Figure 19:
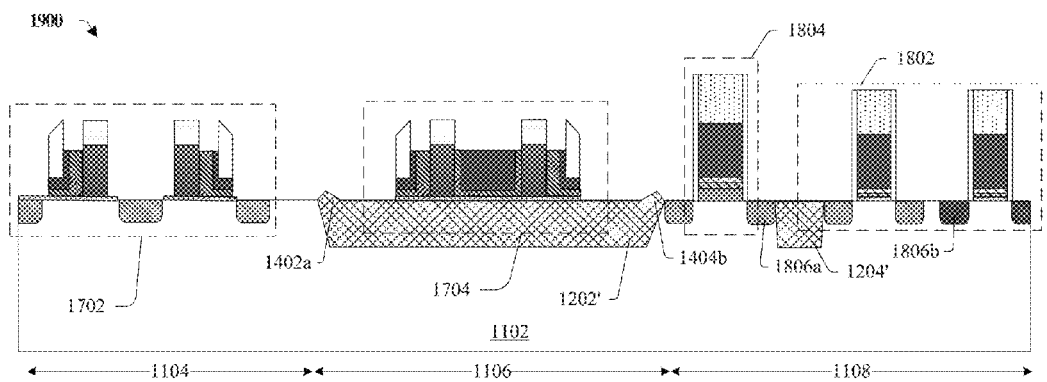

FIG. 19 illustrates a cross-sectional image of semiconductor body 1900, corresponding to act 1016. Here, the protective polysilicon layer 1714' is completely removed. In some embodiments, the protective polysilicon layer may be removed using a dry etchant (e.g., an RIE etch, a plasma etch, etc.) or a wet etchant (e.g., hydrofluoric acid).

Figure 20:
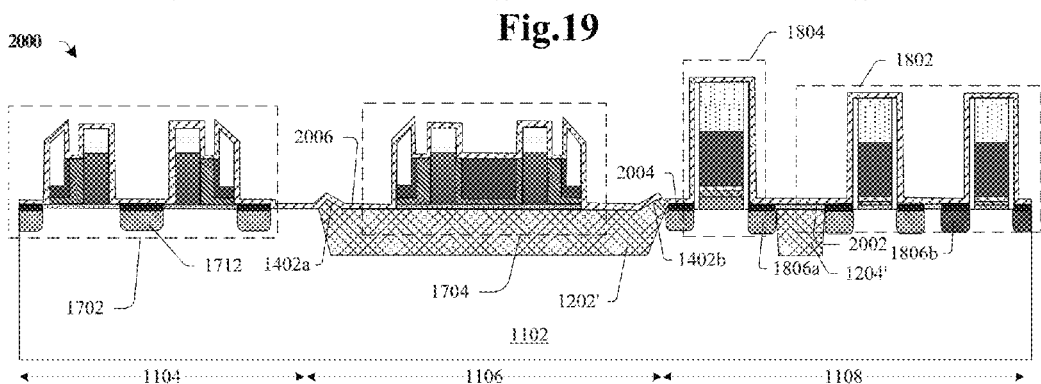

FIG. 20 illustrates a cross-sectional image of semiconductor body 2000, corresponding to act 1018. As shown in FIG. 20, silicide 2004 is formed over the semiconductor substrate 1102 above source/drain regions 1712, 1806a and 1806b. In some embodiments, an interlayer oxide dielectric 2002 is also formed above the substrate between gate structures. A CESL layer 2006 covers the flash memory cells 1702, the memory gate contact structure 1704 and HKMG stacks/transistors 1802 and 1804. The CESL layer 2006 follows the shape of the upper surface of the substrate and thus follows the non-planar periphery regions 1402a and 1402b of the STI region 1202'. In some embodiments, the CESL layer 2006 comprises nickel silicide, cobalt silicide, or titanium silicide.

Figure 21:
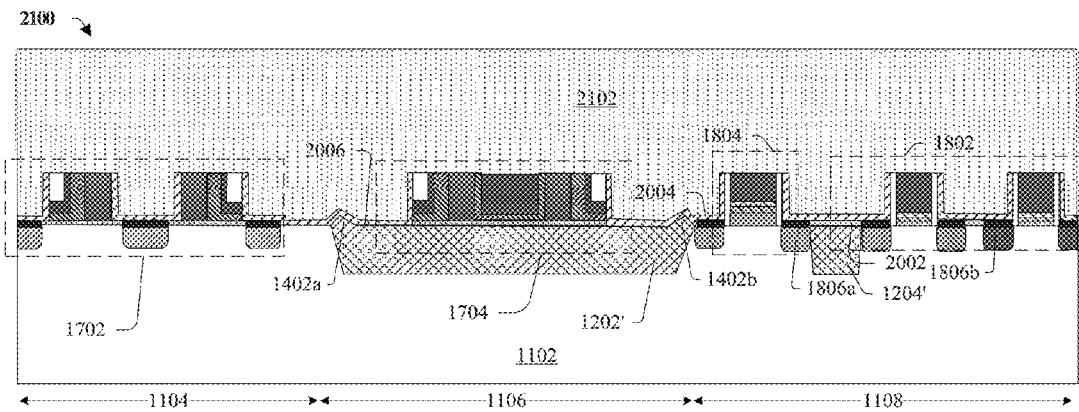

FIG. 21 illustrates a cross-sectional view of a semiconductor body 2100 corresponding to act 1020. As shown in semiconductor body 2100, a first ILD layer 2102 is deposited over the semiconductor substrate 1102. In some embodiments, the first ILD layer 2102 comprises silicon oxide ($SiO_2$) or silicon nitride (SiN), for example.

Figure 22:
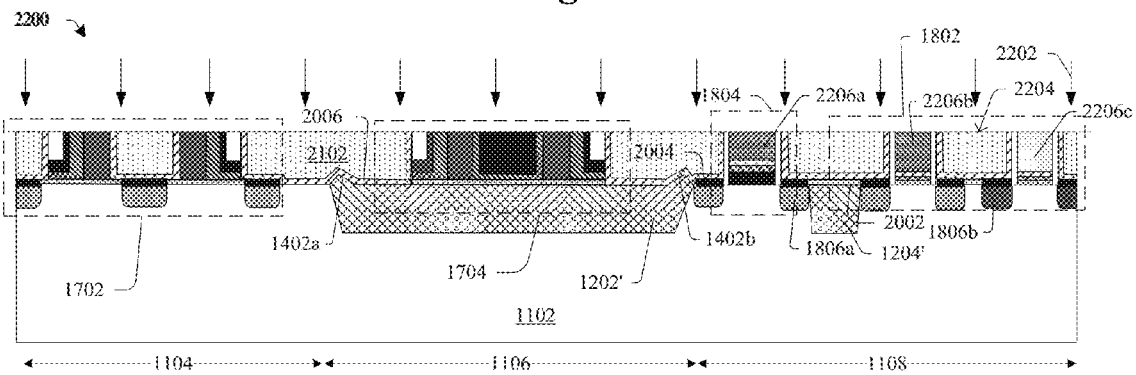

FIG. 22 illustrates a cross-sectional view of a semiconductor body 2200 corresponding to act 1022. As shown by semiconductor body 2200, a CMP process 2202 is performed on the semiconductor body 2200 until the first ILD layer 2102 has been planarized along line 2204. A replacement gate (RPG) process is then performed. The replacement gate process may be performed by removing the sacrificial polysilicon layer 1814 from an opening, and forming a replacement metal gate layer in the opening. Reference numeral 2206a represents an n-metal gate, making the corresponding transistor a HKMG NMOS transistor, while 2206b represents a p-metal gate, which makes the corresponding transistor a HKMG PMOS transistor. During the RPG process, a hard mask layer (not shown) covers the rest of the integrated circuit, during stripping/etching of the sacrificial polysilicon 1814 as well as during deposition of the corresponding metal in the corresponding recesses. After the metals 2206a and 2206b are deposited, a third CMP process is performed to remove excess metal gate material and the hard mask layer.

Figure 23:
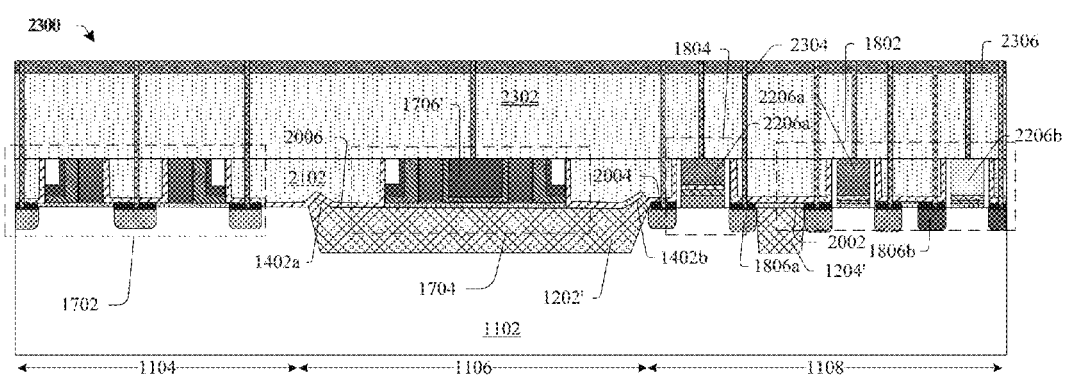

FIG. 23 illustrates a cross-sectional view of a semiconductor body 2300 corresponding to act 1024. As shown by semiconductor body 2300, a second ILD layer 2302 is formed over the semiconductor body 2300 and metal contacts 2304 are formed within the second ILD layer 2302. Metal contacts 2304 extend downward to the silicide layer 2004 and to the upper surfaces of the gate structures 2206a, 2206b and to the memory gate contact pad 1706', and can comprise titanium (Ti), titanium nitride (TiN), or tungsten (W) in various embodiments. In some embodiments, a protective barrier layer 2306 may be formed over the second ILD layer 2302. In some embodiments, the protective barrier layer comprises BPTEOS (borophosphorous tetraethylorthosilicate) and the second ILD layer 2302 comprises silicon dioxide or a low-k dielectric.

Although various embodiments have been illustrated with regards to split gate flash memory cells, it will be appreciated that the present disclosure is also applicable to various types of non-volatile memory (NVM) devices. For example, flash memory cell devices include silicon-oxide-nitride-oxide-silicon (SONOS) split gate flash memory cell devices, metal-oxide-nitride-oxide-silicon (MONOS) split gate flash memory cell devices, and third generation SUPERFLASH (ESF3) memory cell devices. Another type of flash memory that is contemplated as falling within the scope of this disclosure is stacked gate flash memory cell. Split gate flash memory cell devices have several advantages over stacked gate flash memory cell devices, such as lower power consumption, higher injection efficiency, less susceptibility to short channel effects, and over erase immunity; but concepts of the present disclosure are applicable to a wide range of flash memory and are not limited to split gate flash.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

Accordingly, the present disclosure relates to a structure and method for forming an embedded flash HKMG integrated circuit that has a recessed STI region in the memory contact pad region. The recessed planar STI region allows retaining a thicker polysilicon contact pad after CMP processes associated with HKMG integration. Thicker contact pad will have a higher Rs which in turn prevents contact over-etching and reducing Rc. Although the present disclosure illustrates STI recess in a memory gate contact pad structure, it will be appreciated that, the present disclosure is applicable to all structures over which contacts are formed.

In some embodiments, the present disclosure relates to an integrated circuit (IC) for an embedded flash memory device, the IC comprising, a semiconductor substrate comprising a memory array region and a memory contact pad region, wherein the semiconductor substrate in the memory array region comprises an upper surface, and an STI region disposed within the semiconductor substrate in the memory contact pad region, wherein an upper surface of the STI region comprises a planar central region and non-planar peripheral regions, and wherein the planar central region is substantially co-planar with the upper surface of the semiconductor substrate.

In another embodiment, the present disclosure relates to an integrated circuit (IC) for an embedded flash memory device, the IC comprising, a semiconductor substrate including a memory array region and a memory contact pad region, a pair of flash memory cells disposed above the memory array region, a memory gate contact structure disposed above the memory contact pad region, and an STI region disposed within the semiconductor substrate in the memory contact pad region, wherein an upper surface of the STI region comprises a planar central region and non-planar peripheral regions, and wherein the planar central region is substantially co-planar with an upper surface of the semiconductor substrate in the memory array region.

In yet another embodiment, the present disclosure relates to a method of forming an integrated circuit (IC) for an embedded flash memory device, the method comprising: providing a semiconductor substrate having an upper surface, forming a first STI region and a second STI region separated by an active region within the semiconductor substrate, wherein upper surfaces of the first and second STI regions are co-planar and placed at a height above the upper surface, forming a mask over the semiconductor substrate, the mask having an opening that exposes a portion of the first STI region, and performing a first etch with the mask in place to recess the exposed portion of the first STI region so a recessed upper surface of the first STI region is substantially co-planar with the upper surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   a semiconductor substrate having an upper substrate surface;
   a shallow trench isolation (STI) region made of a dielectric material disposed in the semiconductor substrate, wherein the STI region includes non-planar peripheral regions, which extend upward above the upper substrate surface, and also includes a central region, which is recessedly arranged between the non-planar peripheral regions;
   a conductive body which is arranged over the central region and which has a planar upper surface; and
   a contact which is ohmically coupled to the planar upper surface of the conductive body and which is arranged over the central region.

2. The IC of claim 1, wherein the semiconductor substrate comprises:
   an active region adjacent to the STI region and including a non-volatile memory (NVM) device arranged thereon.

3. The IC of claim 2, wherein the conductive body is coupled to a gate of the NVM device and extends horizontally from over the STI region to over the active region.

4. The IC of claim 3, further comprising:
   a high-voltage or low-voltage transistor device that is spaced apart from the NVM device by the STI region;
   wherein the planar upper surface of the conductive body is co-planar with at least one of: an upper gate surface of the high-voltage transistor device or an upper gate surface of the low-voltage transistor device.

5. The IC of claim 4, wherein the conductive body and a gate structure of the high-voltage or low-voltage transistor device are equal in thickness.

6. The IC of claim 1, further comprising a CESL (contact etch stop layer) disposed above the semiconductor substrate and following a shape of the non-planar peripheral regions of the STI region.

7. An integrated circuit (IC) for an embedded flash memory device, the IC comprising:
   a semiconductor substrate including a memory array region and a memory contact pad region;
   a pair of flash memory cells disposed above the memory array region;
   a memory gate contact structure disposed above the memory contact pad region; and
   a shallow trench isolation (STI) region disposed within the semiconductor substrate in the memory contact pad region, wherein an upper surface of the STI region comprises a planar central region and non-planar peripheral regions, and wherein the planar central region is substantially co-planar with an upper surface of the semiconductor substrate in the memory array region.

8. The IC of claim 7, wherein the non-planar peripheral regions protrude above the upper surface of the semiconductor substrate.

9. The IC of claim 7, further comprising a contact etch stop layer (CESL) disposed above the semiconductor substrate covering outer sidewalls of the memory gate contact structure and following a shape of the non-planar peripheral regions.

10. The IC of claim 7, wherein the memory gate contact structure comprises a memory gate (MG) contact pad having an upper surface, and wherein a vertical contact abuts the upper surface.

11. The IC of claim 10, wherein each of the flash memory cells includes:
    a select gate;
    a memory gate spaced from the select gate; and
    a charge trapping dielectric arranged under the memory gate and between neighboring sidewalls of the select and flash memory gates.

12. The IC of claim 11, wherein the memory gate is a horizontal extension of the MG contact pad from a location in the memory contact pad region to over a channel region of the flash memory cell.

13. The IC of claim 12, wherein the upper surface of the MG contact pad is substantially co-planar with an upper surface of the memory gate and a bottom surface of the MG contact pad is substantially co-planar with a bottom surface of the memory gate.

14. The IC of claim 7 further comprising a periphery circuit disposed above the semiconductor substrate, the periphery circuit including HKMG (high-k metal gate) transistors.

15. The IC of claim 14, wherein the HKMG transistors comprise:
    a high-k dielectric layer disposed over the semiconductor substrate;
    an etch-stop layer disposed over the high-k dielectric layer; and
    a metal gate layer disposed over the etch-stop layer.

16. An integrated circuit (IC), comprising:
    a semiconductor substrate having an upper substrate surface;
    a shallow trench isolation (STI) region made of a dielectric material disposed in the semiconductor substrate, wherein the STI region includes non-planar peripheral regions, which extend upward above the upper substrate surface, and also includes a central region, which is recessedly arranged between the non-planar peripheral regions, and wherein vertical, substantially vertical or rounded sidewalls extend between the central region and upper portions of the non-planar peripheral regions; and a conductive body which is arranged directly on the central region of the STI region and which has a planar upper surface.

17. The IC of claim 16, wherein the conductive body is made of doped polysilicon, and an upper surface of the central region is recessed below the upper substrate surface.

18. The IC of claim 16, further comprising:
dielectric material disposed over the STI region and over the conductive body; and
a contact extending vertically through the dielectric material to make ohmic contact with the planar upper surface of the conductive body directly over the central region.

* * * * *